United States Patent
Chen et al.

(10) Patent No.: US 9,245,842 B2
(45) Date of Patent: Jan. 26, 2016

(54) SEMICONDUCTOR DEVICES HAVING GUARD RING STRUCTURE AND METHODS OF MANUFACTURE THEREOF

(71) Applicant: Taiwan Semiconductor Manufacturing Company, Ltd., Hsin-Chu (TW)

(72) Inventors: Hsien-Wei Chen, Hsin-chu (TW); Nien-Fang Wu, Chiayi (TW); Hung-Yi Kuo, Taipei (TW); Jie Chen, New Taipei (TW); Ying-Ju Chen, Yunlin County (TW); Tsung-Yuan Yu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 180 days.

(21) Appl. No.: 13/689,385

(22) Filed: Nov. 29, 2012

(65) Prior Publication Data

US 2014/0145346 A1    May 29, 2014

(51) Int. Cl.
| | |
|---|---|
| *H01L 23/48* | (2006.01) |
| *H01L 23/522* | (2006.01) |
| *H01L 23/528* | (2006.01) |
| *H01L 23/532* | (2006.01) |
| *H01L 23/58* | (2006.01) |

(52) U.S. Cl.
CPC ........ *H01L 23/5226* (2013.01); *H01L 23/5283* (2013.01); *H01L 23/5329* (2013.01); *H01L 23/585* (2013.01); *H01L 2924/0002* (2013.01)

(58) Field of Classification Search
USPC ............ 257/774, E21.499, E23.18, E21.599; 438/106, 113
See application file for complete search history.

(56) References Cited

U.S. PATENT DOCUMENTS

| | | | |
|---|---|---|---|
| 2005/0151248 A1* | 7/2005 | Shau | 257/734 |
| 2009/0267193 A1* | 10/2009 | Hayasaki | 257/620 |
| 2010/0314727 A1* | 12/2010 | Uchida et al. | 257/659 |
| 2012/0038028 A1* | 2/2012 | Yaung et al. | 257/620 |
| 2013/0256826 A1* | 10/2013 | Gambino et al. | 257/496 |
| 2014/0035106 A1* | 2/2014 | Vu et al. | 257/620 |

* cited by examiner

*Primary Examiner* — Matthew Gordon
(74) *Attorney, Agent, or Firm* — Slater & Matsil, L.L.P.

(57) ABSTRACT

Semiconductor devices and methods of manufacture thereof are disclosed. In one embodiment, a method of manufacturing a semiconductor device includes forming a first functional region of an integrated circuit over a workpiece, and forming a second functional region of the integrated circuit over the workpiece. The method includes forming a guard ring around the first functional region of the integrated circuit. The guard ring is formed in a material layer disposed over the first functional region and the second functional region.

20 Claims, 11 Drawing Sheets

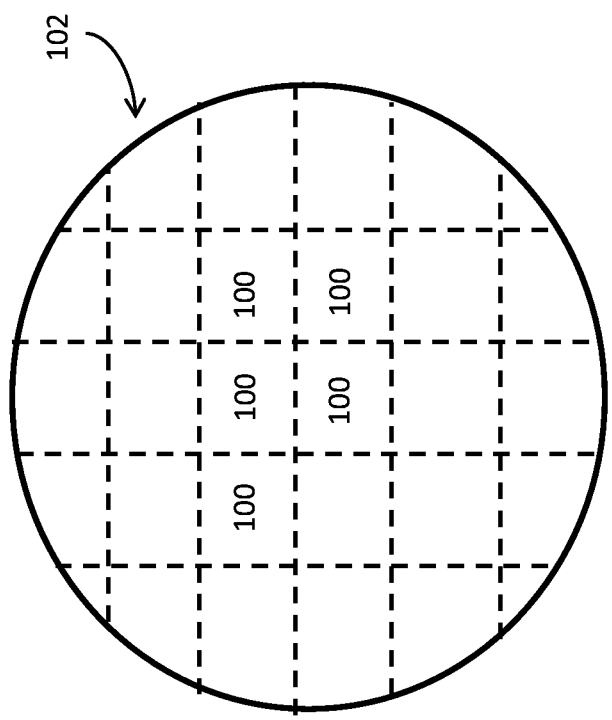

SEMICONDUCTOR DEVICES HAVING GUARD RING STRUCTURE AND METHODS OF MANUFACTURE THEREOF

BACKGROUND

Semiconductor devices are used in a variety of electronic applications, such as personal computers, cell phones, digital cameras, and other electronic equipment, as examples. Semiconductor devices are typically manufactured by providing a workpiece, forming various material layers over the workpiece, and patterning the material layers using lithography to form integrated circuits. The semiconductor industry continues to improve the integration density of various electronic components of integrated circuits, i.e., transistors, diodes, resistors, capacitors, etc., by continual reductions in minimum feature size, which allow more components to be integrated into a given area.

Conductive materials such as metals or semiconductors are used in semiconductor devices for making electrical connections for the integrated circuits. For many years, aluminum was used as a metal for conductive materials for electrical connections, and silicon dioxide was used as an insulator. However, as devices are decreased in size, the materials for conductors and insulators have changed in order to improve device performance. Copper is now often used as a conductive material for interconnects in some applications. Low dielectric constant (k) materials and extra-low k (ELK) materials have begun to be implemented in some designs for insulating materials of interconnects.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 15 illustrates a top view of a workpiece with a plurality of integrated circuits formed thereon, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to semiconductor devices and methods of manufacture thereof. Novel guard rings for multi-function integrated circuits will be described herein.

Figure 1:
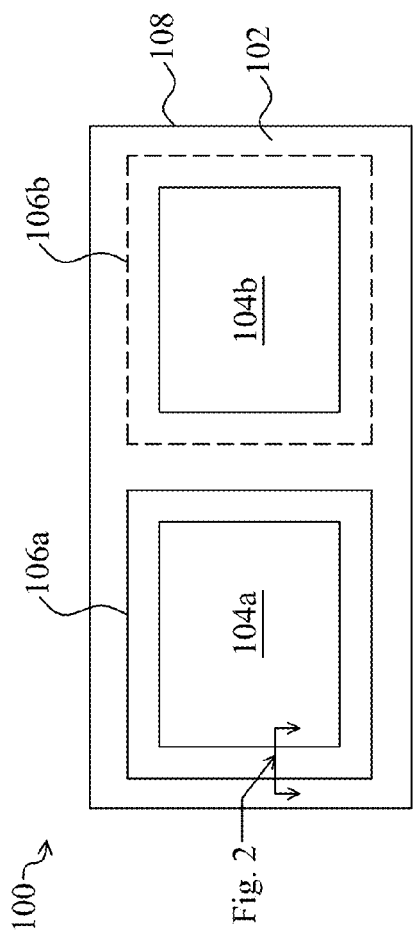
FIG. 1 is a top view of a semiconductor device in accordance with some embodiments, wherein a guard ring is formed around a functional region of an integrated circuit.

Referring first to FIG. 1, a top view of a semiconductor device 100 in accordance with some embodiments is shown, wherein a guard ring 106a is formed around a functional region 104a of an integrated circuit. The semiconductor device 100 includes a workpiece 102. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include semiconductor elements such as transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

Active regions are formed in and/or over the workpiece 102 in functional regions 104a and 104b of the semiconductor device 100. The active regions may comprise transistors such as transistor 116 shown in FIG. 2, logic devices, memory devices, or other types of circuitry. Only two functional regions 104a and 104b are shown in FIG. 1; however, in accordance with some embodiments, three or more functional regions 104 are formed on a single integrated circuit, to be described further herein.

The guard ring 106a is formed around a perimeter of functional region 104a. The guard ring 106a is formed in the upper material layers of the semiconductor device 100 in some embodiments. The guard ring 106a is formed in the metallization layers $M_1$, $V_1$, and $M_N$ (see FIG. 2) of the semiconductor device 100, for example, to be described further herein. The guard ring 106a is formed in every metallization layer $M_1$, $V_1$, and $M_N$ of the semiconductor device 100 in some embodiments.

Referring again to FIG. 1, a seal ring 108 is formed around a perimeter of the integrated circuit. The seal ring 108 is formed around the guard ring 106a disposed around the functional region 104a. The seal ring 108 is also around the functional region 104b. In some embodiments, the seal ring 108 is formed in the same material layer or layers that the guard ring 106a is formed in.

In some embodiments, a guard ring 106a is formed on only one functional region 104a, or on only some functional regions 104a of the semiconductor device 100. In other embodiments, a guard ring 106a is formed on all of the functional regions 104a and 104b of the semiconductor device 100. For example, a guard ring 106b is shown in phantom disposed around the perimeter of the functional region 104b in FIG. 1.

Figure 2:
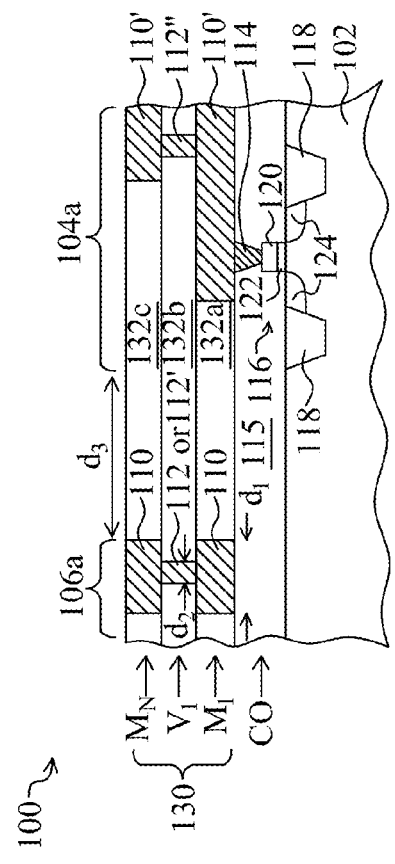
FIG. 2 is a cross-sectional view of a portion of the semiconductor device shown in FIG. 1.

FIG. 2 is a cross-sectional view of a portion of the semiconductor device 100 shown in FIG. 1. A cross-sectional view of the guard ring 106a and a portion of the functional region 104a are shown. An example of an active region in the functional region 104a is illustrated wherein the active region comprises a transistor 116. Alternatively, the functional region 104a may comprise other types of circuitry. The transistor 116 includes source and drain regions 124 formed within the workpiece 102 that are defined at the edges by shallow trench isolation (STI) regions 118. The transistor 116 includes a gate dielectric 122 formed over the workpiece 102 between the source and drain regions 124, and a gate 120 disposed over the gate dielectric 122.

The semiconductor device 100 includes a contact layer CO that includes contacts 114 formed in an insulating material 115 that is disposed over the transistor 116 and other active devices of the functional region 104a, not shown. The contacts 114 make electrical contact with the gate 120 of the transistor 116. Other contacts 114 may also be formed, such as contacts for the source and drain regions 124 of the transistor 116, not shown. A plurality of metallization layers $M_1$, $V_1$, and $M_N$ is formed over the contact layer CO, where conductive lines 110' and vias 112" are formed that provide electrical connections for the functional region 104a.

The guard ring 106a is formed in the metallization layers $M_1$, $V_1$, and $M_N$ of the semiconductor device 100. The guard ring 106a comprises a conductive line 110 formed in metallization layer $M_1$, conductive vias 112 or one or more via bars 112' formed in metallization layer $V_1$ coupled to a top surface of the conductive line 110 in metallization layer $M_1$, and a conductive line 110 formed in metallization layer $M_N$ that is coupled to the conductive vias 112 or one or more via bars 112'. The conductive line 110 in metallization layer $M_1$, conductive vias 112 or one or more via bars 112', and conductive line 110 formed in metallization layer $M_N$ are formed in insulating material layers 132a, 132b, and 132c, respectively. The insulating material layers 132a, 132b, and 132c are also referred to herein as a material layer 130.

The conductive lines 110 of the guard ring 106a comprise Cu, a Cu alloy, other metals, or multiple layers or combinations thereof, for example. The conductive lines 110 of the guard ring 106a comprise a width in the cross-sectional view comprising dimension $d_1$. Dimension $d_1$ comprises about 0.1 μm or greater in some embodiments, as an example. In some embodiments, dimension $d_1$ comprises about 1.5 μm, as another example. Alternatively, dimension $d_1$ may comprise other values, and the conductive lines 110 may comprise other materials. The conductive lines 110 are continuous in the example shown. Alternatively, the conductive lines 110 may be discontinuous, to be described further herein.

The conductive vias 112 or via bars 112' of the guard ring 106a also comprise Cu, a Cu alloy, other metals, or multiple layers or combinations thereof, for example. Alternatively, the conductive vias 112 or via bars 112' may comprise other materials. The conductive vias 112 or via bars 112' comprise a width in the cross-sectional view comprising dimension $d_2$.

Dimension $d_2$ comprises about 0.05 μm or greater in some embodiments, as an example. Alternatively, dimension $d_2$ may comprise other values. The conductive vias 112 may comprise an array of a plurality of vias 112 disposed between the conductive lines 110 in metallization layers $M_1$ and $M_N$, or a continuous or discontinuous via bar 112' disposed between the conductive lines 110 in metallization layers $M_1$ and $M_N$.

The guard ring 106a is spaced apart from the perimeter of the functional region 104a by a dimension $d_3$ comprising about 0.1 μm or less in some embodiments, as an example. In other embodiments, the guard ring 106 may be spaced apart from the perimeter of the functional region 104a by other dimensions.

One or more of the insulating material layers 132a, 132b, and/or 132c may comprise a low dielectric constant (k) material having a dielectric constant or k value less than the dielectric constant of silicon dioxide, which is about 3.9, in some embodiments. In other embodiments, one or more of the insulating material layers 132a, 132b, and/or 132c may comprise an extra low k (ELK) material having a dielectric constant or k value of about 2.5 or less, as another example. The insulating material layers 132a, 132b, and/or 132c may comprise a dielectric film such as a Black Diamond™ (BD) film, fluorinated silicon glass (FSG), or other materials having a thickness of about 70 to 210 nm, as examples. Alternatively, the insulating material layers 132a, 132b, and/or 132c may comprise other materials and dimensions. Some of these materials have a low structural strength, and the guard ring 106a disposed proximate the perimeter of the functional region 104a advantageously provides increased structural support and robustness for the semiconductor device 100. The guard ring 106a also prevents or reduces the likelihood of delamination of the insulating materials 132a, 132b, and/or 132c, for example.

To manufacture the semiconductor device 100, the workpiece 102 provided, and the active regions are formed in the functional regions 104a and 104b, such as transistors 116. Contacts 114 are formed in an insulating material 115 that is formed over the workpiece 102 and active regions. The metallization layers $M_1$, $V_1$, and $M_N$ are formed using subtractive or damascene techniques. Two adjacent metallization layers $V_1/M_N$ may be simultaneously formed using a dual damascene technique in some embodiments, as another example. The guard ring 106a is advantageously formed simultaneously with the formation of the conductive lines 110' and vias 112" of the functional regions 104a in some embodiments. In other embodiments, the guard ring 106a may alternatively be formed using a separate manufacturing or lithography process step.

Figure 4:
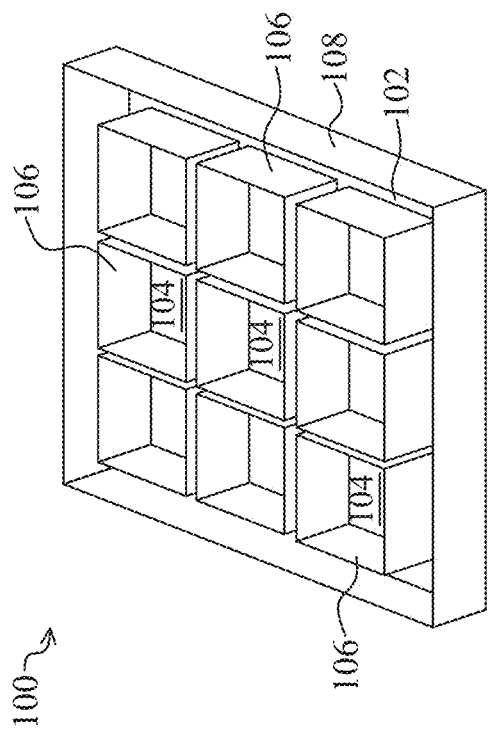
FIG. 4 is a perspective view of the semiconductor device shown in FIG. 3.
Figure 3:
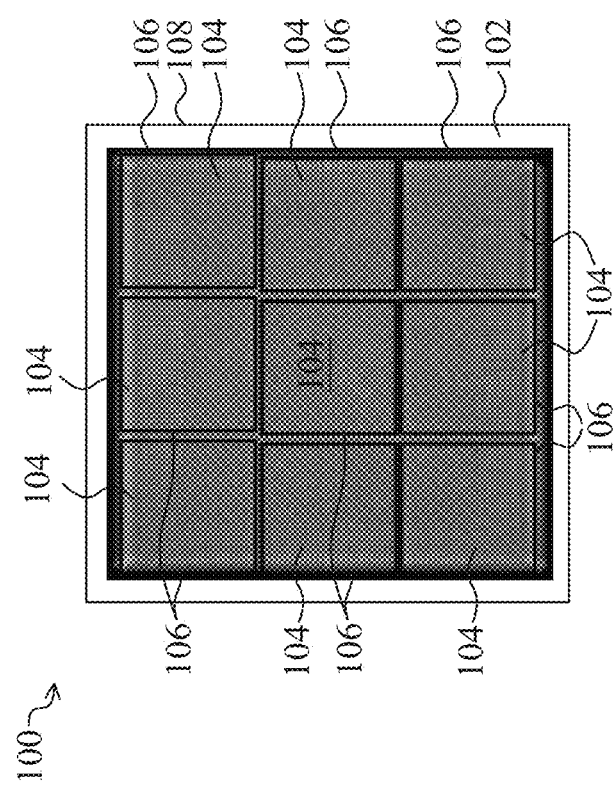
FIG. 3 is a top view of a semiconductor device in accordance with other embodiments, wherein a guard ring is formed around each functional region of an integrated circuit.

FIG. 3 is a top view of a semiconductor device 100 in accordance with other embodiments, wherein a guard ring 106 is formed around each functional region 104 of an integrated circuit. FIG. 4 is a perspective view of the semiconductor device 100 shown in FIG. 3. A seal ring 108 is formed around the perimeter of the semiconductor device 100, e.g., around the guard rings 106 disposed around the functional regions 104.

The functional regions 104 comprise substantially the same size and shape in the embodiment shown in FIGS. 3 and 4. The functional regions 104 may comprise a plurality of memory devices or other types of devices having similar or the same functions, as an example. Alternatively, the functional regions 104 may comprise different functions.

In FIG. 4, for simplicity, conductive lines and vias formed in the metallization layers $M_1$, $V_1$, and/or $M_N$ over the functional regions 104 are not shown; however, conductive lines and vias may be formed in the same metallization layers $M_1$, $V_1$, and/or $M_N$ over the functional regions 104 that the guard rings 106 are formed in, in some embodiments. Every functional region 104 and guard ring 106 is not labeled in FIG. 4 (or in FIGS. 5 and 6), also to simplify the drawings.

Figure 5:
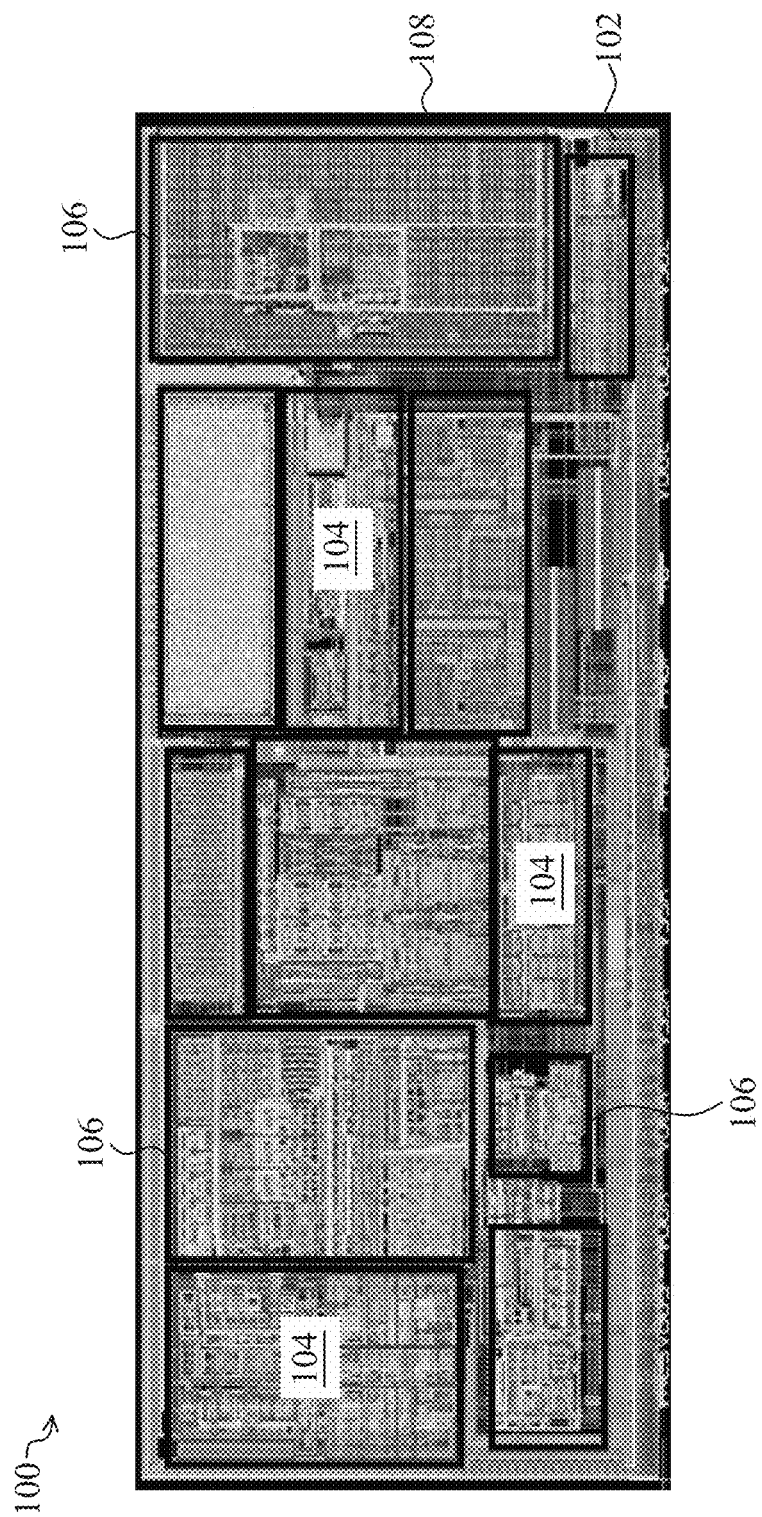
FIG. 5 is a top view of a semiconductor device in accordance with other embodiments, wherein a guard ring is formed around each functional region of an integrated circuit.
Figure 6:
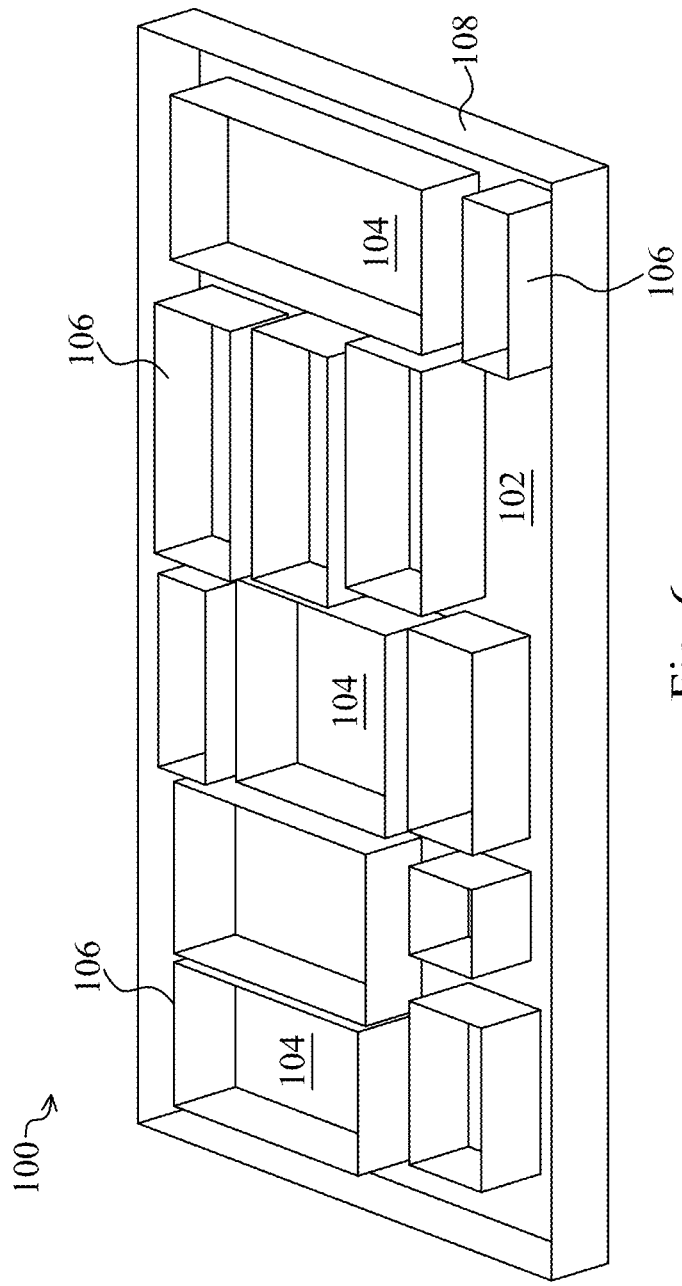
FIG. 6 is a perspective view of the semiconductor device shown in FIG. 5.

FIG. 5 is a top view of a semiconductor device 100 in accordance with other embodiments, wherein a guard ring 106 is formed around each functional region 104 of an integrated circuit. FIG. 6 is a perspective view of the semiconductor device 100 shown in FIG. 5. The functional regions 104 comprise different shapes and sizes in the embodiment shown. The functional regions 104 may also comprise different or substantially the same functions. The functional regions 104 may comprise various functions, circuitry, or modules, for example, depending on the application and type of semiconductor device 100.

The semiconductor device 100 comprises a single integrated circuit including the functional regions 104, wherein the integrated circuit is fabricated on a workpiece 102 comprising a semiconductor wafer. A plurality of the integrated circuits are manufactured on the workpiece 102 (as shown in FIG. 15) and are later singulated into a plurality of semiconductor devices 100 comprising systems-on-a chip (SOCs), each including a plurality of functional regions 104 in some embodiments, for example.

Figure 7:
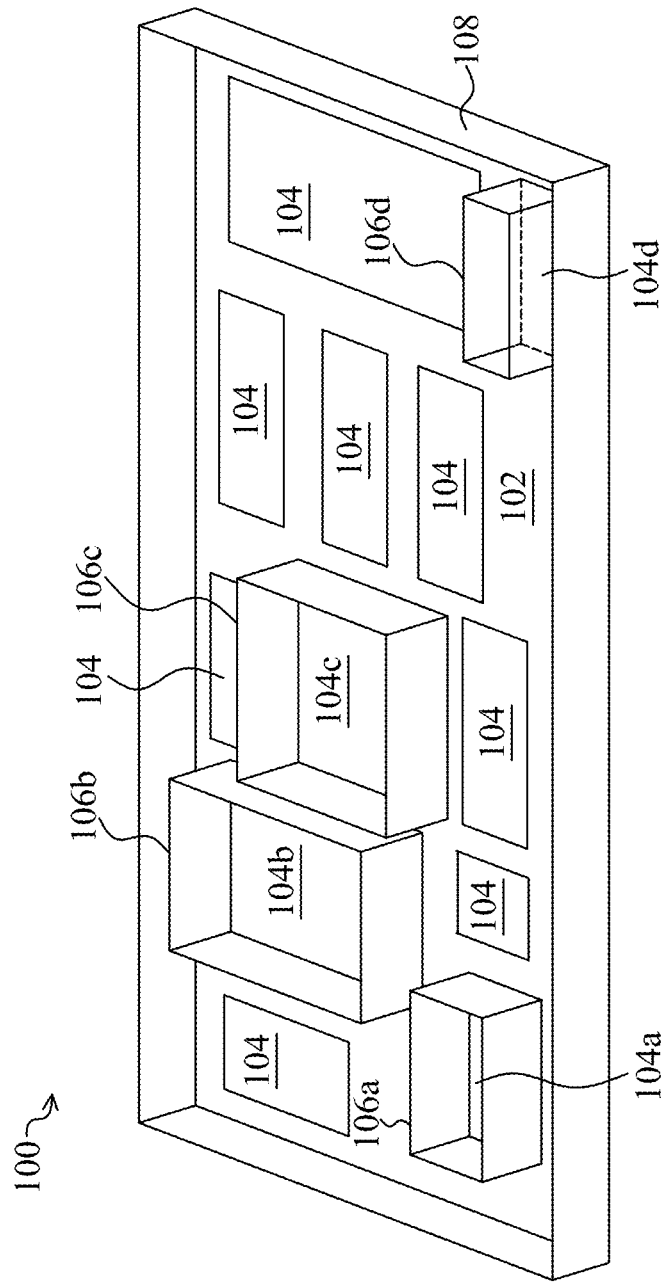
FIG. 7 is a perspective view of a semiconductor device in accordance with some embodiments, wherein a guard ring is formed around some functional regions of an integrated circuit.

FIG. 7 is a perspective view of a semiconductor device 100 in accordance with some embodiments, wherein a guard ring 106a, 106a, 106c, and 106d is formed around some functional regions 104a, 104b, 104c, and 104d, respectively, of an integrated circuit. A guard ring is not formed on other functional regions 104. The guard rings 106a, 106b, 106c, and 106d can be included in the semiconductor device 100 around predetermined functional regions 104a, 104b, 104c, and 104d, for example. The guard rings 106a, 106b, 106c, and 106d can be included in the semiconductor device 100 around specific functional regions 104a, 104b, 104c, and 104d that need and benefit from increased robustness, for example. The guard rings 106a, 106b, 106c, and 106d can also, or alternatively, be included in the semiconductor device 100 around functional regions 104a, 104b, 104c, and 104d where there is sufficient area for the guard rings 106a, 106b, 106c, and 106d, as another example.

Figure 8:
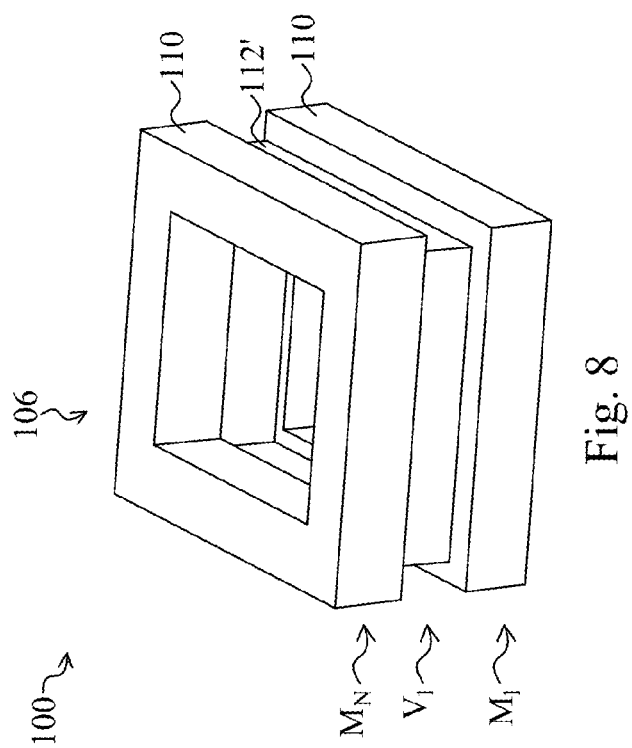
FIG. 8 is a perspective view of a guard ring in accordance with some embodiments, wherein the guard ring is continuous.

FIG. 8 is a perspective view of a guard ring 106 of a semiconductor device 100 in accordance with some embodiments, wherein the guard ring 106 is continuous. Conductive lines 110 formed in metallization layers $M_1$ and $M_N$ each comprise a continuous conductive line 100. A single continuous via bar 112' comprises a continuous conductive line formed in metallization layer $V_1$. The continuous via bar 112' has a smaller width than conductive lines 110. The continuous guard ring 106 shown in FIG. 8 is fully sealed and provides a large improvement in robustness of the semiconductor device 100 proximate the guard ring 106. A continuous guard ring 106 may be formed around the perimeter of one or more functional circuits 104 of a semiconductor device 100 in accordance with some embodiments of the present disclosure.

Figure 9:
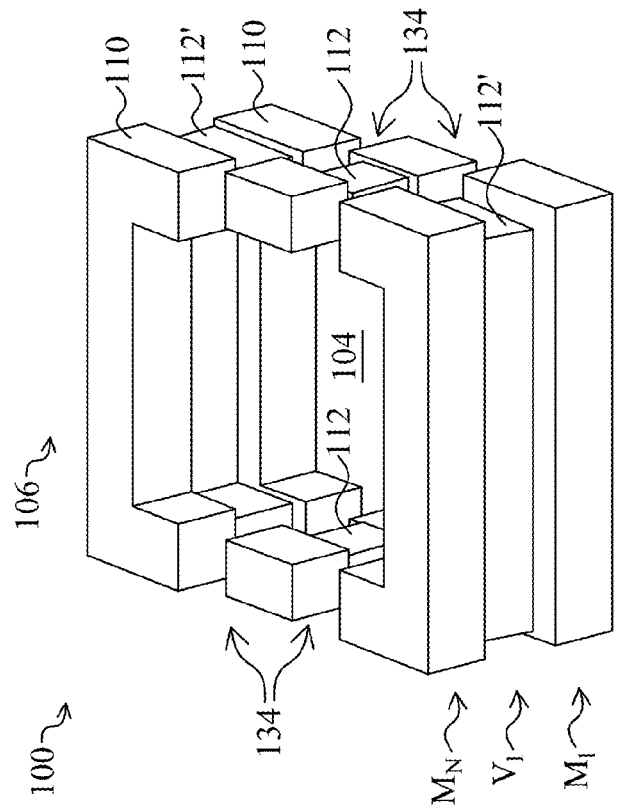
FIG. 9 is a perspective view of a guard ring in accordance with other embodiments, wherein the guard ring is discontinuous.

FIG. 9 is a perspective view of a guard ring 106 of a semiconductor device 100 in accordance with other embodiments, wherein the guard ring 106 is discontinuous. The conductive lines 110 in metallization layers $M_1$ and $M_N$ are discontinuous, and the via bars 112' in metallization layer $V_1$ are also discontinuous in some embodiments. Metallization layer $V_1$ may include one or more vias 112 disposed between the via bars 112'. Alternatively, only one of the conductive lines 110 in metallization layer $M_1$ or $M_N$ may be discontinuous. The discontinuous regions 134 of the guard ring 106 allow for circuit routing; e.g., to another area or region of the semiconductor device 100.

Figure 10:
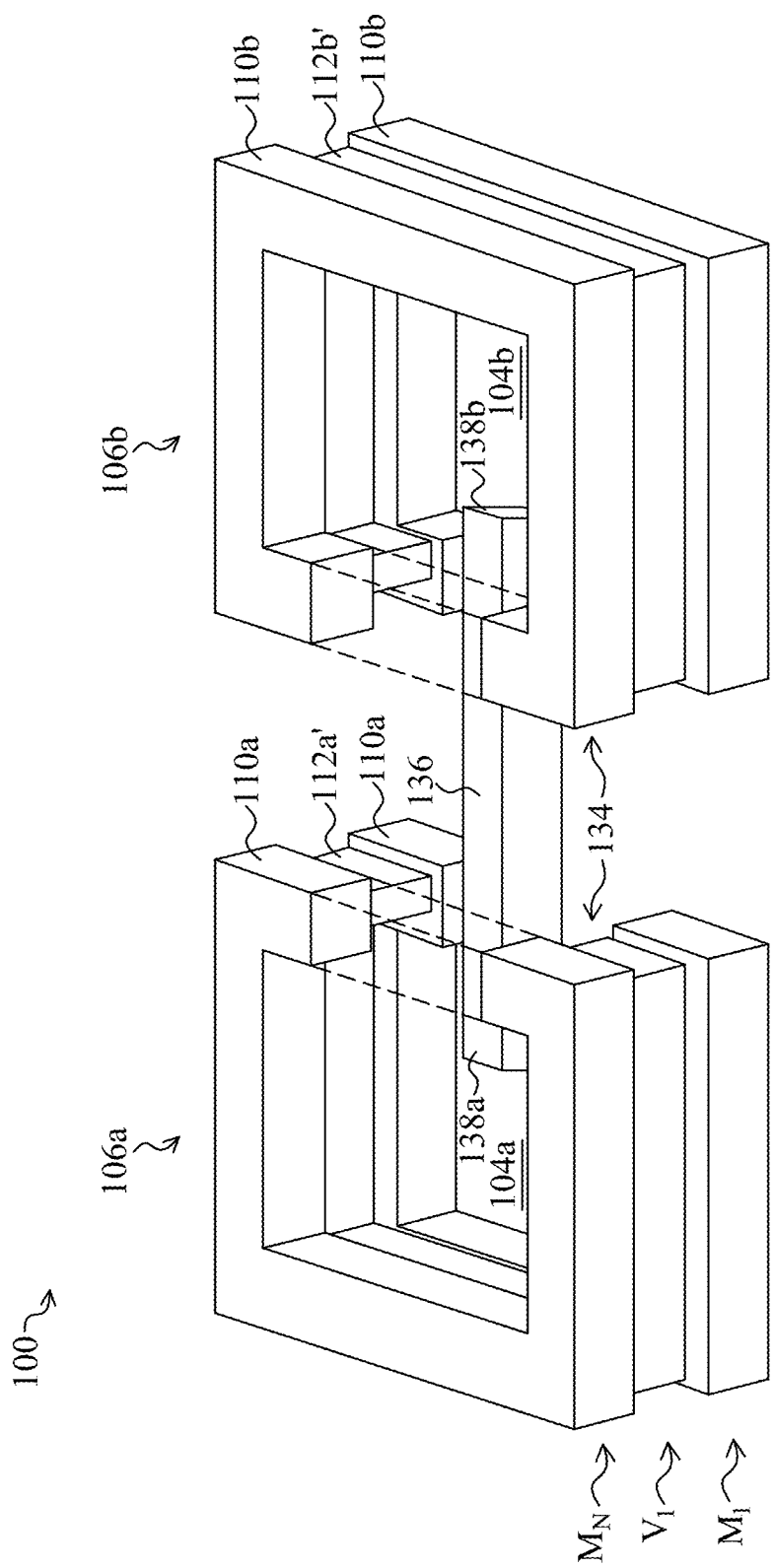
FIG. 10 is a perspective view of two guard rings in accordance with some embodiments, wherein a circuit routing line is routed through the discontinuous regions of the guard rings.

FIG. 10 is a perspective view of two guard rings 106a and 106b in accordance with some embodiments, wherein a circuit routing line 136 is routed through the discontinuous regions 134 of the guard rings 106a and 106b. The guard rings 106a and 106b are each discontinuous on one side in the embodiment shown. Both conductive lines 110a and 110b in the metallization layers $M_1$ and $M_N$ of the guard rings 106a and 106b, respectively, may be discontinuous, or only one conductive line 110a in metallization layer $M_1$ (or $M_N$, not shown) of the guard rings 106a and 106b, respectively, may be discontinuous, as shown in phantom in FIG. 10. The via bars 112a' and 112b' of the guard rings 106a and 106b, respectively, are both discontinuous. One end 138a of the circuit routing line 136 may be electrically coupled to functional region 104a, and another end 138b of the circuit routing line 136 may be electrically coupled to functional region 104b, to provide electrical connection between the functional regions 104a and 104b, in some embodiments. Alternatively, the discontinuous regions 134 of the guard rings 106a and 106b may be used to provide electrical connection of the functional regions 104a or 104b to other regions, contact pads, or input/output regions of the semiconductor device 100, for example, not shown.

Figure 12:
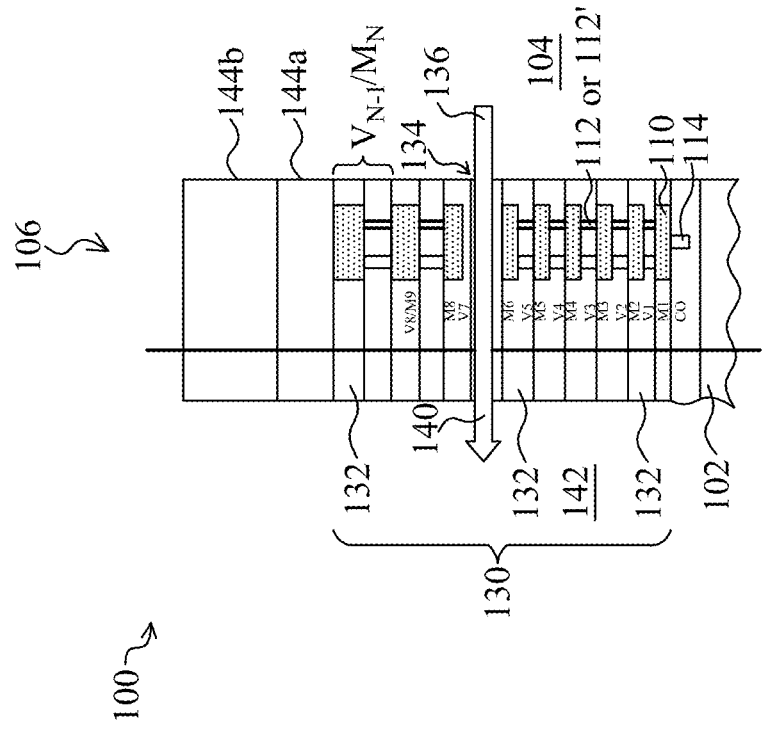
FIGS. 11 and 12 are cross-sectional views of a portion of a guard ring in accordance with some embodiments.
Figure 11:
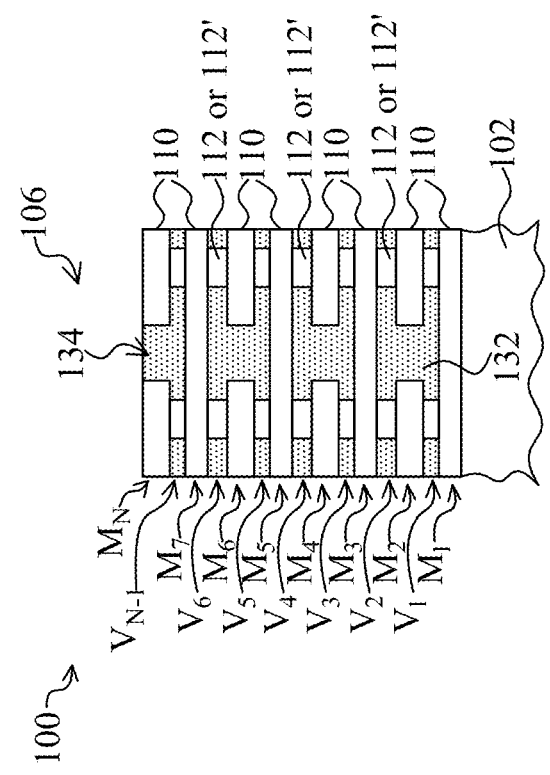

FIGS. 11 and 12 are cross-sectional views of a portion of a guard ring 106 of a semiconductor device 100 in accordance with some embodiments. Vias 112 or via bars 112' are formed in metallization layers $V_1$ through $V_{N-1}$, and conductive lines 110 are formed in metallization layers $M_1$ through $M_N$. Passivation layers 144a and 144b (see FIG. 12) are disposed over the top metallization layer $V_{N-1}/M_N$ formed within an insulating material layer 132. In FIG. 11, some of the conductive lines 110 are continuous, and other conductive lines 110 are discontinuous and include a discontinuous region 134.

In FIG. 12, a circuit routing line 136 is formed in a discontinuous region 134 of the guard ring 106. The circuit routing line 136 provides electrical connection from the functional region 104 to an exterior region 142 of the functional region 104. The circuit routing line 136 is adapted to output a signal 140 from the functional region 104 of the semiconductor device 100 to the exterior region 142 of the functional region 104, for example. For simplicity, not all of the conductive lines 110, vias 112 or via bars 112', or insulating material layers 132 are labeled in FIGS. 11 and 12.

Figure 13:
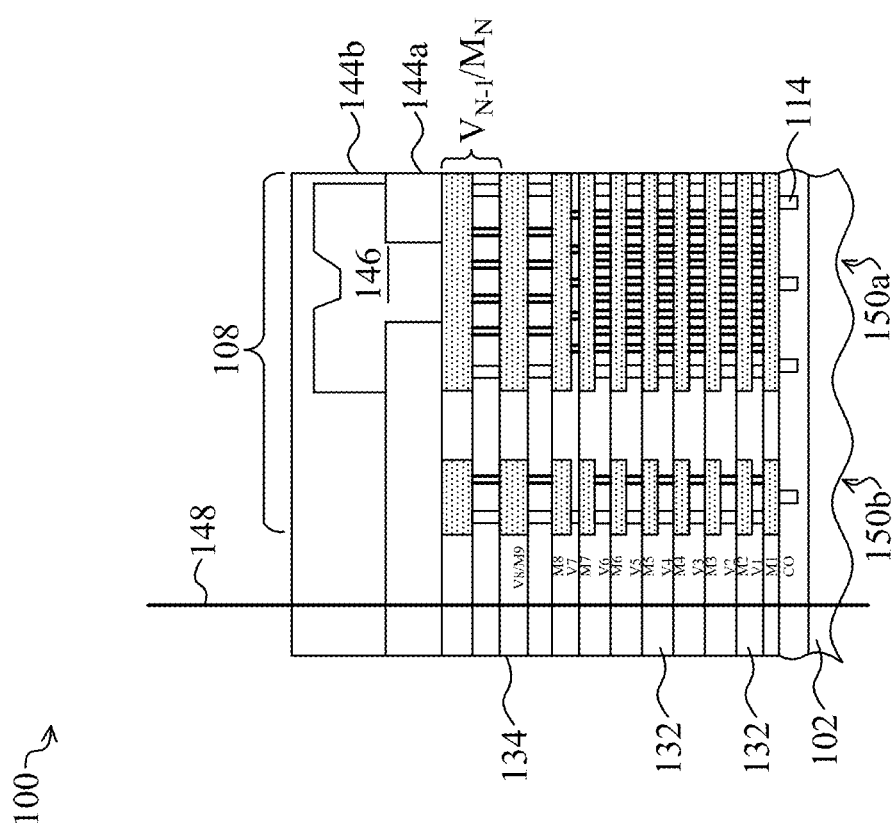
FIG. 13 is a cross-sectional view of a seal ring that is disposed around a plurality of guard rings of a semiconductor device in accordance with some embodiments.

FIG. 13 is a cross-sectional view of a more detailed view of a seal ring 108 that is disposed around a plurality of guard rings 106 (not shown in FIG. 13; see FIG. 12) of a semiconductor device 100 in accordance with some embodiments. The seal ring 108 is formed proximate scribe lines 148 of the semiconductor device 100. Portions of the seal ring 108 are formed in the same material layers $M_1$ through $M_N$ and $V_1$ through $V_{N-1}$ that portions of the guard rings 106 (see FIG. 12) are formed in. The seal ring 108 comprises two concentric rings 150b and 150a of conductive material, wherein the larger ring 150a includes a conductive material 146 disposed proximate a top surface thereof. The seal ring 108 reduces or prevents cracking during die sawing and prevents damage from moisture in the finished integrated circuit. The smaller ring 150b comprises a sacrificial component in some embodiments that is destroyed in the sawing process, and the larger ring 150a is left remaining in the structure, for example. Alternatively, the seal ring 108 may comprise a single large ring 150a and the smaller ring 150b may not be included, for example, not shown.

Figure 14:
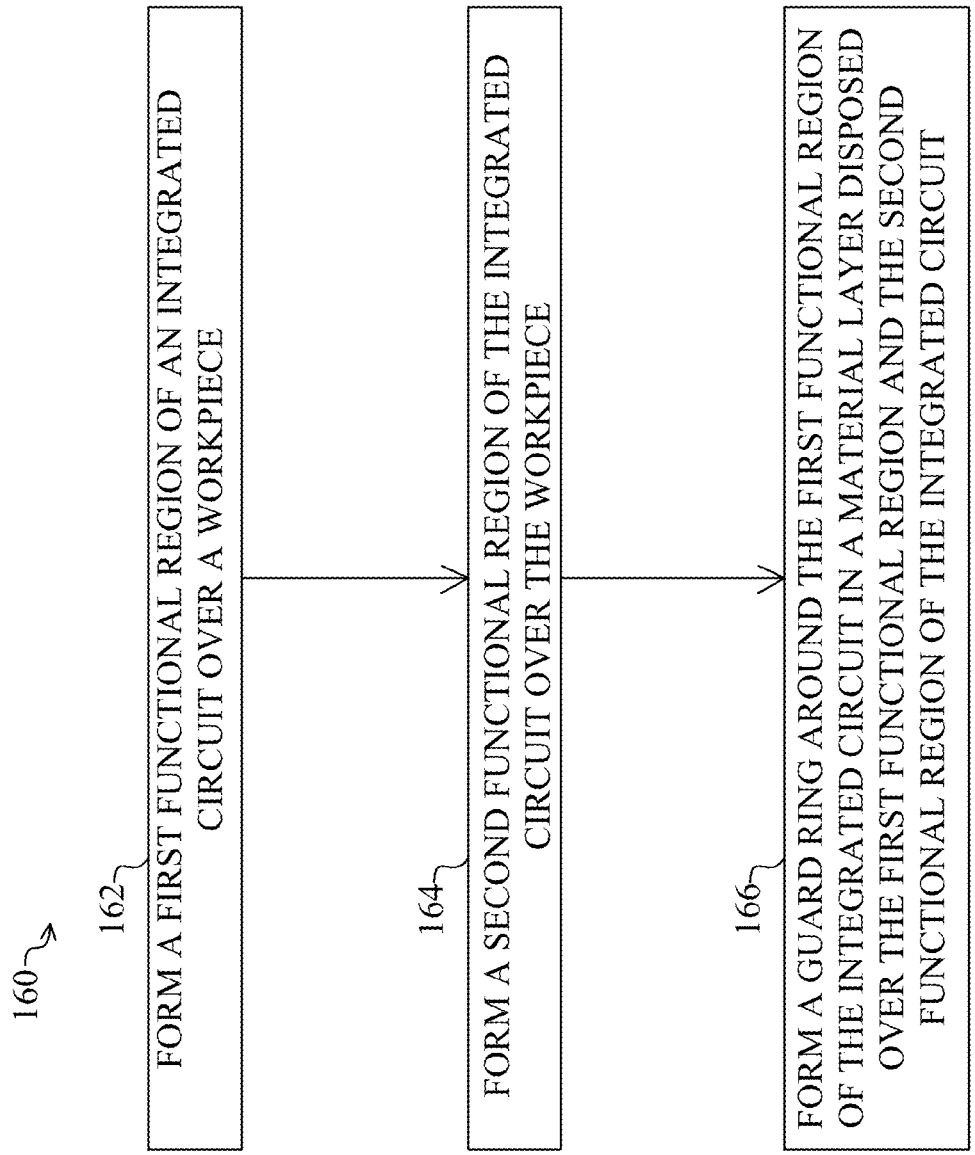
FIG. 14 is a flow chart of a method of manufacturing a semiconductor device in accordance with some embodiments.

FIG. 14 is a flow chart 160 of a method of manufacturing a semiconductor device in accordance with some embodiments. In step 162, a first functional region of an integrated circuit is formed over a workpiece. In step 164, a second functional region of the integrated circuit is formed over the workpiece. In step 166, a guard ring is formed around the first functional region of the integrated circuit in a material layer disposed over the first functional region and the second functional region of the integrated circuit.

Some embodiments of the present disclosure include methods of manufacturing semiconductor devices. Other embodiments include semiconductor devices 100 that include the novel guard rings 106, 106a, 106b, 106c, and 106d described herein.

Advantages of some embodiments of the disclosure include providing novel guard rings 106, 106a, 106b, 106c, and 106d that reduce or prevent delamination of insulating material layers 132, 132a, 132b, and 132c of semiconductor devices 100 and strengthen the overall structure of the integrated circuits, resulting in integrated circuits with reinforced strength. Stress in the insulating material layers 132, 132a, 132b, and 132c is reduced due to the conductive material tower structures (e.g., comprised of the conductive lines 110 and vias 112 and/or via bars 112') of the guard rings 106, 106a, 106b, 106c, and 106d, resulting in delamination protection for the insulating material layers 132, 132a, 132b, and 132c of the material layer 130 the guard rings 106, 106a, 106b, 106c, and 106d are formed in. The guard rings 106, 106a, 106b, 106c, and 106d are particularly beneficial in providing robustness-enhanced structures for insulating material layers 132, 132a, 132b, and 132c of the material layer 130 in embodiments wherein the insulating material layers 132, 132a, 132b, and 132c comprise ELK materials, for example. The novel guard rings 106, 106a, 106b, 106c, and 106d provide improved mechanical support within the semiconductor device 100 (e.g., of the integrated circuit).

The guard rings 106, 106a, 106b, 106c, and 106d also provide noise reduction or prevention, due to the conductive materials of the conductive lines 110 and vias 112 and/or via bars 112'. The guard rings 106, 106a, 106b, 106c, and 106d also function as shields, preventing noise from affecting the functional regions 104, 104a, 104b, 104c, and 104d and/or preventing the functional regions 104, 104a, 104b, 104c, and 104d from emitting noise that may deleteriously affect other functional regions 104, 104a, 104b, 104c, and 104d and/or devices external to the semiconductor devices 100, as examples. Functional regions 104, 104a, 104b, 104c, and 104d can be protected from noise from other functional regions 104, 104a, 104b, 104c, and 104d in a single integrated circuit by implementing the novel guard rings 106, 106a, 106b, 106c, and 106d described herein.

No additional lithography masks or processes are required to include the guard rings 106, 106a, 106b, 106c, and 106d in back-end-of-line (BEOL) processes and structures in some embodiments; rather, existing photolithography masks and processes used to form conductive lines 110' and vias 112" for the functional regions 104a (see FIG. 2) can be modified to form the novel guard rings 106, 106a, 106b, 106c, and 106d described herein. Furthermore, the novel guard ring 106, 106a, 106b, 106c, and 106d structures and designs are easily implementable in manufacturing process flows.

In accordance with some embodiments of the present disclosure, a method of manufacturing a semiconductor device includes forming a first functional region of an integrated circuit over a workpiece, and forming a second functional region of the integrated circuit over the workpiece. The method includes forming a guard ring around the first functional region of the integrated circuit. The guard ring is formed in a material layer disposed over the first functional region and the second functional region.

In accordance with other embodiments, a semiconductor device includes a first functional region of an integrated circuit disposed over a workpiece and a second functional region of the integrated circuit disposed over the workpiece. A guard ring is disposed around a perimeter of the first functional region. The guard ring is disposed in a material layer disposed over the first functional region and the second functional region.

In accordance with other embodiments, a semiconductor device includes a plurality of functional regions of an integrated circuit disposed over a workpiece. A guard ring is disposed around one of the plurality of functional regions. The guard ring is disposed in a material layer disposed over the plurality of functional regions. A seal ring is disposed in the material layer around the guard ring and the plurality of functional regions of the integrated circuit.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
   forming a plurality of integrated circuits (ICs) on a substrate, each of the plurality of ICs being individually surrounded by a respective seal ring;
   each of the plurality of ICs including a plurality of functional regions;
   forming in a material layer disposed over a first functional region of each IC a first guard ring around the first functional region of the IC, wherein the first guard ring is inside and separate from the seal ring; and
   forming in the material layer disposed over a second functional region of each IC a second guard ring around the second functional region of the IC, wherein the second guard ring is inside and separate from the seal ring and separate from the first guard ring, wherein at least one functional region of the IC does not have a guard ring around it, and wherein each guard ring is inside and separate from the respective seal ring surrounding the IC in which the guard ring is formed.

2. The method according to claim 1, further comprising forming a circuit routing line electrically connecting the first functional region having the first guard ring around it to the second functional region having the second guard ring around it.

3. The method according to claim 1, wherein forming the first guard ring comprises forming the first guard ring in a back-end-of-line (BEOL) manufacturing process.

4. The method according to claim 1, wherein forming the first guard ring comprises forming one or more conductive lines and vias in the material layer disposed over the first functional region of the IC.

5. A semiconductor device, comprising:
an integrated circuit (IC) die disposed over a workpiece, the integrated circuit die including
a first functional region within the IC die, a second functional region within the IC die, and a third functional region within the IC die;
the first functional region having a first guard ring disposed around a perimeter thereof, wherein the first guard ring is disposed in a material layer disposed over the first functional region, wherein the first guard ring is disposed within the IC die;
the second functional region having a second guard ring disposed around a perimeter thereof, wherein the second guard ring is disposed in the material layer disposed over the second functional region, wherein the second guard ring is disposed within the IC die and separate from the first guard ring;
the third functional region being free of a guard ring disposed around a perimeter thereof; and
a seal ring surrounding the integrated circuit die individually, wherein the seal ring encircles the guard rings within it and is separate from the guard rings.

6. The semiconductor device according to claim 5, wherein the material layer comprises a plurality of insulating material layers.

7. The semiconductor device according to claim 6, wherein each of the guard rings comprises a plurality of conductive lines disposed in the plurality of insulating material layers.

8. The semiconductor device according to claim 7, wherein each of the guard rings further comprises a plurality of conductive vias or a via bar disposed between two of the plurality of conductive lines, and wherein the plurality of conductive vias or the via bar is disposed in one of the plurality of insulating material layers.

9. The semiconductor device according to claim 8, wherein the semiconductor device comprises a plurality of metallization layers, and wherein the guard rings are disposed in each of the plurality of metallization layers of the semiconductor device.

10. The semiconductor device according to claim 7, wherein one of the plurality of conductive lines of the first guard ring is discontinuous.

11. The semiconductor device according to claim 10, further comprising a circuit routing line having a first end and a second end, wherein the first end of the circuit routing line is coupled to the first functional region of the integrated circuit, and wherein the circuit routing line extends through the discontinuous one of the plurality of conductive lines.

12. The semiconductor device according to claim 11, wherein the second end of the circuit routing line is coupled to the second functional region of the integrated circuit.

13. A semiconductor device, comprising:
a plurality of functional regions of an integrated circuit (IC) disposed over a workpiece;
a first guard ring disposed inside the IC and around a first one of the plurality of functional regions, the first guard ring being disposed in a material layer disposed over the plurality of functional regions;
a second guard ring disposed inside the IC and around a second one of the plurality of functional regions, the second guard ring being disposed in the material layer disposed over the plurality of functional regions;
at least one of the plurality of functional regions disposed over the workpiece without a guard ring around it; and
a seal ring disposed in the material layer around the first and the second guard rings and the plurality of functional regions of the integrated circuit, wherein the seal ring individually surrounds the IC and is spaced apart from the first and the second guard rings.

14. The semiconductor device according to claim 13, wherein the material layer comprises an insulating material.

15. The semiconductor device according to claim 14, wherein the insulating material comprises a low dielectric constant (k) material having a dielectric constant of less than about 3.9.

16. The semiconductor device according to claim 13, wherein the first guard ring is continuous.

17. The semiconductor device according to claim 13, wherein the first guard ring comprises a conductive material.

18. The semiconductor device according to claim 17, wherein a portion of the first guard ring comprises a conductive line, and wherein the conductive line comprises a width of about 0.1 µm or greater.

19. The semiconductor device according to claim 13, wherein the first guard ring comprises a plurality of discontinuous sections.

20. The semiconductor device according to claim 13, wherein the seal ring comprises a plurality of concentric rings.

* * * * *